United States Patent
Yang et al.

[11] Patent Number: 6,077,737
[45] Date of Patent: Jun. 20, 2000

[54] METHOD FOR FORMING A DRAM HAVING IMPROVED CAPACITOR DIELECTRIC LAYERS

[75] Inventors: Ming-Ta Yang, Da-Nei Hsiang; Chih-Hsun Chu, Hsinchu, both of Taiwan

[73] Assignee: Mosel Vitelic, Inc., Hsin Chu, Taiwan

[21] Appl. No.: 09/089,015

[22] Filed: Jun. 2, 1998

[51] Int. Cl.⁷ .............................................. H01L 21/8242
[52] U.S. Cl. ..................... 438/240; 438/253; 438/709; 438/723
[58] Field of Search ............................... 438/240, 3, 253, 438/250, 239, 393, 396, 706, 709, 710, 723

[56] References Cited

U.S. PATENT DOCUMENTS

| | | |
|---|---|---|
| 5,403,434 | 4/1995 | Moslehi . |
| 5,442,585 | 8/1995 | Eguchi et al. . |
| 5,741,722 | 4/1998 | Lee .......................................... 438/240 |
| 5,824,158 | 10/1998 | Takeuchi et al. ....................... 118/715 |
| 5,837,615 | 11/1998 | Rostoker ................................. 438/711 |

*Primary Examiner*—Tuan H. Nguyen
*Attorney, Agent, or Firm*—Heller Ehrman White & McAuliffe

[57] ABSTRACT

A method of fabricating a DRAM device having nitride/oxide or tantalum pentoxide dielectric layers. The method includes: forming field oxide regions on a substrate to define active regions; forming at each active region a MOSFET comprising a top dielectric layer; forming a contact window in the MOSFET top dielectric layer; generating a doped poly-Si bottom electrode of a capacitor in electrical connection with the MOSFET through the contact window; removing surface oxide of the bottom electrode using both chemical and inductive coupled plasma (ICP) treatments; depositing nitride/oxide dielectric layers or a tantalum pentoxide dielectric layer on the ICP-treated bottom electrode; generating a doped poly-Si top electrode of the capacitor.

19 Claims, 3 Drawing Sheets

METHOD FOR FORMING A DRAM HAVING IMPROVED CAPACITOR DIELECTRIC LAYERS

BACKGROUND OF THE INVENTION

1. Field of the Invention

This invention relates to the fabrication of DRAMs in general, and more particularly to the fabrication of a stacked-capacitor DRAM having improved dielectric layers.

2. Description of the Prior Art

DRAM (dynamic random access memory) is one of the essential integrated memory chips that form the foundation of modern computer memories. The storage capacity of memory chips including DRAMs is indicated in bits. The bit density of DRAMs has doubled every few years, from 16 kbit chips in the 1970s to today's 16 Mbit and 64 Mbit chips. DRAMs are especially suitable for very high density (e.g. 16–256 Megabit), high speed (e.g., 35-nanosecond) applications.

Unlike non-volatile memory chips such as $E^2$PROMs (EEPROMS) or flash memory chips, a DRAM cell is a volatile memory device that loses the information stored in it as soon as the power supply is switched off. This unique feature is attributed to the fundamental design of a DRAM cell, which essentially comprises a transistor and a capacitor. Functionally, the capacitor is used to store electrical charges corresponding to the digital information, while the transistor provides for the switching function. The transistor is usually a metal-oxide semiconductor field effect transistor (MOSFET), and the capacitor is usually a parallel-plate capacitor (or a variation thereof). Typically, a DRAM cell is fabricated by sequentially forming a MOSFET and a capacitor on a semiconductor substrate. A contact window is made so that one of the electrodes (i.e., the storage node) of the capacitor can be electrically connected to the source of the MOSFET. This electrical connection allows a capacitor to obtain digital information from bit line and word line arrays through its corresponding MOSFET. The other electrode or node of the capacitor is electrically connected to a reference potential.

In a parallel-plate capacitor, the capacitance is given by $$C=(\epsilon/t)A$$

where C is the capacitance, $\epsilon$ is the permittivity (i.e., the dielectric constant multiplying by the permittivity of vacuum) of the dielectric material located between the top and bottom electrodes, t is the thickness of the dielectric layer, and A is the overlapping area between the top and bottom electrodes, i.e., the surface area of the capacitor. Apparently, the capacitance of a parallel-plate capacitor may be increased by: (1) the use of a different substance having a higher dielectric constant; (2) a reduction in the thickness of the layer of the dielectric substance; and/or (3) an increase in the surface area of the capacitor.

Because most of the available space in a typical DRAM chip is taken up by the capacitors whereas its transistors utilize relative little space, many prior-art developments have focused on various geometry variations to increase the surface area of the capacitors without increasing the overall size of the chip. Such developments involve the cutting of deep trenches with large depth-to-opening aspect ratios in the dielectric layers, the use of three-dimensional stacking of capacitor layers, and the use of corrugated instead of flat surfaces.

Some progress was also made in replacing standard capacitor materials (e.g., silicon nitride) with substances having higher dielectric constants, e.g., tantalum pentoxide ($Ta_2O_5$). Other developments include the use of polysilicon with hemispherical grains deposited at the phase transformation temperature (i.e., from amorphous to crystalline) via a chemical vapor deposition (CVD) process; see M. Sakao et al., "A Capacitor-Over-Bit-Line Cell with Hemispherical-Grain Storage Node for 64 Mb DRAMs," IEDM Tech. Dig., 1990, p. 655.; and the use of a cylindrical capacitor incorporating hemispherical grained silicon; see H. Watanabe et al., "A New Cylindrical Capacitor Using Hemispherical Grained Si for 256 Mb DRAMs," IEDM Tech. Dig., December 1992, pp. 259–262. Further, the use of crown-shaped capacitors have also been suggested in T. Kaga et al, IEEE Trans. Electron Devices, Vol. 38, No.2, P.255, 1991. However, the fabrication of each of the above devices requires a much complicated process and is thus not economically competitive.

Furthermore, the aforesaid increase in the bit density of the DRAM chip is accompanied by a trend of shrinkage of the size of the DRAM cell, resulting in not only an increasing number of capacitors per chip but also a drastically decreasing area available for each capacitor. As the capacitor is miniaturized, its surface area and the electrical charges stored therein are also drastically reduced. As a result, more "soft errors" (errors in stored information), e.g., those caused by particles, may take place, and the capacitor must be "refreshed" more often. Thus, it is imperative that the above shrinkage in the size of the DRAM cells is not done at the expense of the ability of the capacitors to store information.

In a conventional stacked-capacitor DRAM, the dielectric material is either silicon dioxide/silicon nitride/silicon dioxide (O/N/O) or silicon nitride/silicon dioxide (N/O). For DRAMs having bit densities under 64 Megabit, an O/N/O structure having a thickness between 7 nm and 20 nm is the preferred dielectric; for DRAMs having bit densities equal to or more than 64 Megabit, a thinner N/O structure is the preferred dielectric. To form successfully a structure having N/O dielectric layers, however, the native oxide on the substrate must first be removed by, e.g., hydrofluoric acid.

As shown in FIG. 1, a polysilicon (poly-Si) layer 12 is deposited and lithographically patterned on top of a Si substrate 10. This first poly-Si layer 12 will serve as the bottom electrode of the capacitor. During the pre-cleaning before a silicon nitride layer 14 is grown, a native oxide layer 13 forms on top of the polysilicon (poly-Si) layer. This native oxide layer 13 is typically approximately 0.5 to 1 nm thick. After the nitride layer 14 is deposited, a silicon dioxide layer 16 is deposited on top of it. This is followed by the deposition of a second poly-Si layer 18 to serve as the top capacitor electrode.

The aforementioned native oxide layer 13 causes at least two major problems. First, it results in an increase in the incubation time of the nitride layer 14. Second, the nitride layer grown on top of this native layer will initially have an silicon-rich portion before the stoichiometric ratio, i.e., $Si_3N_4$, is reached; this Si-rich portion will increase the equivalent thickness of the oxide.

Alternatively, if a CVD or PVD (physical vapor deposition) $Ta_2O_5$ is used as the dielectric substance, an annealing process is necessary to reduce any leakage current and hydrocarbon inclusion caused by the deposition of $Ta_2O_5$. However, because this annealing process is generally conducted in an oxygenated environment, oxygen may diffuse through the $Ta_2O_5$ layer and react with the surface of the bottom poly-Si electrode of the capacitor, resulting in a dielectric constant less than 25. Although the aforesaid oxidation of the bottom electrode may be prevented by forming a thin silicon oxynitride (Si:O:N) layer on the surface of the bottom electrode via either a conventional high-temperature batch furnace annealing process (in NH$_3$) or a rapid thermal nitridation (RTN) process, the latter process is a single-wafer process which would reduce the throughput of the entire DRAM fabrication process. In addition, both of the above processes may result in the possible penetration of hydrogen atoms through the bottom electrode.

SUMMARY OF THE INVENTION

It is therefore an object of the present invention to provide a method of fabricating a DRAM having stacked capacitors with silicon nitride/silicon dioxide dielectric layers.

It is another object of the present invention to provide a method of fabricating a DRAM cell having a stoichiometric nitride dielectric layer which increases the specific conductance of the cell and as a result reduces soft errors.

It is a further object of the present invention to provide a method of fabricating a DRAM with dielectric layers deposited upon a polysilicon bottom electrode having essentially no remaining surface native oxide.

It is yet another object of the present invention to provide a method of fabricating a DRAM having a tantalum pentoxide dielectric layer grown on a polysilicon bottom electrode, the polysilicon layer having a thin and uniform oxynitride surface region.

In a specific embodiment of the present invention, a semiconductor DRAM having nitride/oxide dielectric layers is fabricated in accordance with the following steps:

forming, on a substrate having active regions defined by field oxide regions, MOSFETs each comprising a gate oxide layer, a first poly-Si gate electrode layer, and a top dielectric layer;

forming a contact window in the top dielectric layer of the MOSFET;

forming a second, doped poly-Si layer filling the contact window and covering portions of the top dielectric layer of the MOSFET;

patterning the second poly-Si layer to form the bottom electrode of a capacitor;

removing native oxide from, and generating an oxidation-resistant layer on, the surface of the poly-Si bottom electrode using an inductive coupled nitrogen plasma (ICNP);

depositing a silicon nitride dielectric layer on the ICNP-treated poly-Si bottom electrode; the nitride dielectric layer may be subjected to a further ICNP treatment to repair defects in silicon nitride dielectric layer;

growing a silicon oxide dielectric layer on the nitride layer;

depositing a third, doped poly-Si layer on the oxide layer; and patterning the third poly-Si layer to form the top electrode of the capacitor.

In another specific embodiment of the present invention, a semiconductor DRAM having a tantalum pentoxide dielectric layer is fabricated in accordance with the following steps:

forming, on a substrate having an active region defined by a field oxide region, a MOSFET comprising a gate oxide layer, a first poly-Si gate electrode layer, and a top dielectric layer;

forming a contact window in the top dielectric layer of the MOSFET;

forming a second, typically doped poly-Si layer filling the contact window and covering portions of the top dielectric layer of the MOSFET;

patterning the second poly-Si layer to form the bottom electrode of a capacitor;

removing native oxide from, and generating an oxidation-resistant region on, the surface of the poly-Si bottom electrode using an inductive coupled nitrogen plasma (ICNP);

depositing a tantalum pentoxide dielectric layer on the ICNP-treated poly-Si bottom electrode;

annealing the pentoxide layer;

depositing a third, typically doped poly-Si layer on the pentoxide layer; and patterning the third poly-Si layer to form the top electrode of the capacitor.

An advantage of the present invention is that it provides an improved stacked-capacitor DRAM in which the native oxide on the polysilicon bottom electrode is minimized.

Another advantage of the present invention is that it provides a more reliable stacked-capacitor DRAM in which soft errors caused by particles are minimized.

A further advantage of the present invention is that it provides an improved method of fabricating a DRAM using tantalum pentoxide as the dielectric layer, in which method process-induced hydrogen penetration through the bottom electrode is eliminated.

Yet another advantage of the present invention is that it provides an improved method of fabricating DRAM cells having bit densities of 64 Megabit or more.

These and other objects, features and advantages of the present invention will no doubt become apparent to those skilled in the art after reading the following detailed description of the preferred embodiment which is illustrated in the several figures of the drawing.

IN THE DRAWINGS

DETAILED DESCRIPTION OF THE PREFERRED EMBODIMENTS

While the present invention may be embodied in many forms, details of a preferred embodiment are schematically shown in FIGS. 2 through 6, with the understanding that the present disclosure is not intended to limit the invention to the embodiment illustrated.

The present invention discloses a semiconductor process for fabricating DRAMs having stacked capacitors with silicon nitride/silicon dioxide (N/O) or tantalum pentoxide ($Ta_2O_5$) dielectric layers. By employing an inductive coupled plasma (ICP) treatment step, the present process effectively suppresses the growth of the native surface oxide on the polysilicon (poly-Si) bottom electrode, thus allowing efficient formation of the N/O dielectric on top of the poly-Si bottom electrode. The present process also forms a thin and uniform Si:O:N surface layer via an ICP process on the poly-Si bottom electrode, thus permitting effective formation of the $Ta_2O_5$ dielectric on the bottom electrode.

Figure 1:
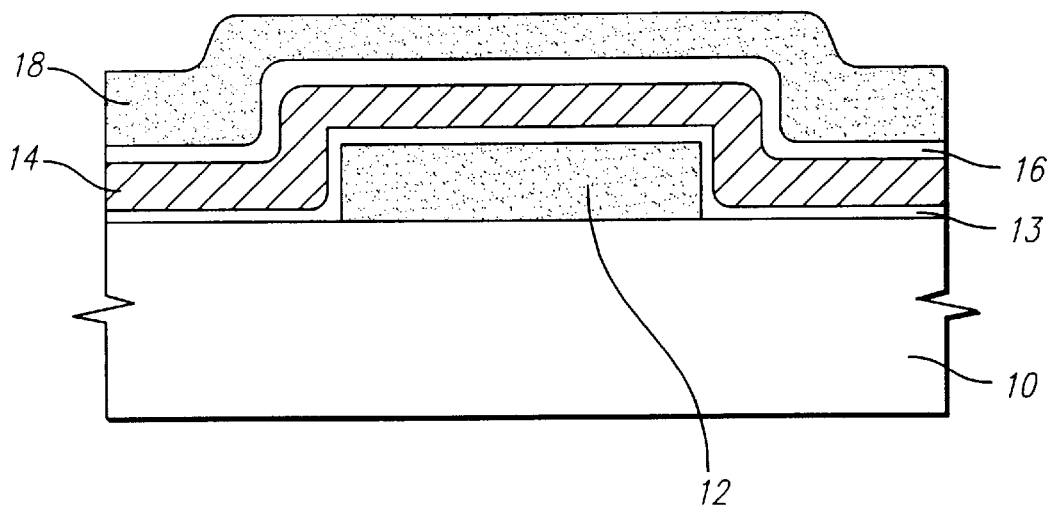
FIG. 1 is a cross-sectional representation of a prior-art stacked capacitor.
Figure 2:
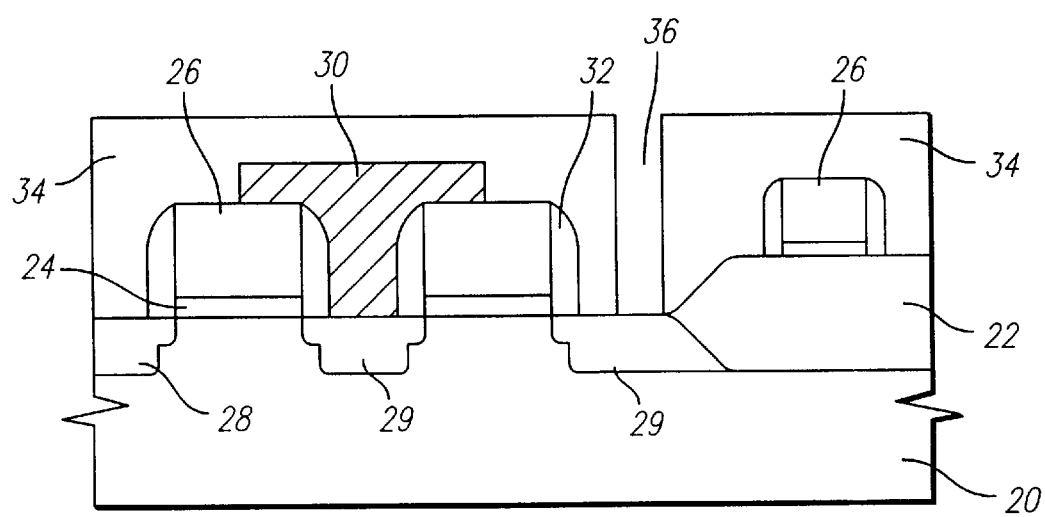
FIG. 2 is a cross-sectional representation of the MOSFET portion of a DRAM structure made in accordance with the present invention.

In one specific embodiment of the present invention, a DRAM cell having stacked capacitors with nitride/oxide dielectric layers is fabricated via the process described below. As shown in FIG. 2, a single-crystal Si<100> is used as the substrate 20. Selected portions of the surface of the substrate 20 are first oxidized to form field oxide (FOX) regions which define an active area by electrically isolating such areas from the surrounding surface regions of the substrate 20. The FOX region 22 shown in FIG. 2 may be formed partially or completely inset in the substrate 20. Typically, the FOX region 22 is formed by the LOCOS (local oxidation of silicon) process comprising the steps of: (i) depositing a composite layer of silicon nitride ($Si_3N_4$) and silicon dioxide ($SiO_2$) on the substrate 20; (ii) patterning the composite layer via a photolithographic etching process; (ii) removing the photoresist layer; and (iii) forming the field oxide region 22 by thermally oxidizing the exposed portion of the substrate 20 at 850 to 1050° C., using the patterned composite layer as the etching mask; the FOX region 22 thus formed is approximately 400 to 600 nm thick; and (iv) removing silicon nitride by hot phosphoric acid and removing silicon dioxide by hydrofluoric acid.

Again in FIG. 2, a metal-oxide semiconductor field effect transistor (MOSFET) is formed on the substrate 20 having an active area defined by the FOX region 22. As is known to those skilled in the art, a first silicon dioxide layer 24 is formed on the substrate 20 to serve as the gate oxide layer of the MOSFET. This oxide layer 24 has a typical thickness of 5 to 20 nm, and is typically formed via a thermal oxidation process at 850 to 1000° C. Alternatively, this oxide layer 24 can be formed via a chemical vapor deposition (CVD) process. A first polysilicon (poly-Si) layer is then deposited on the oxide layer 24, the field oxide 22 and the substrate 20, typically via a CVD process. The typical thickness of this poly-Si layer is approximately 200 to 400 nm. As is known to those skilled in the art, the poly-Si layer is then lithographically patterned into the gate electrode 26; this is followed by the formation of the lightly doped drain (LDD) region 28, the source-drain (S/D) region 29, the bit line 30 and the sidewall spacers 32, respectively. A dielectric layer 34 of non-doped silicate glass (NSG) is subsequently formed on top of the gate electrode 26, the field oxide 22 and the substrate 20. This completes the formation of the MOSFET portion of the DRAM cell. Next, a contact window 36 is formed within the dielectric layer 34 via lithographic and etching process.

Figure 3:
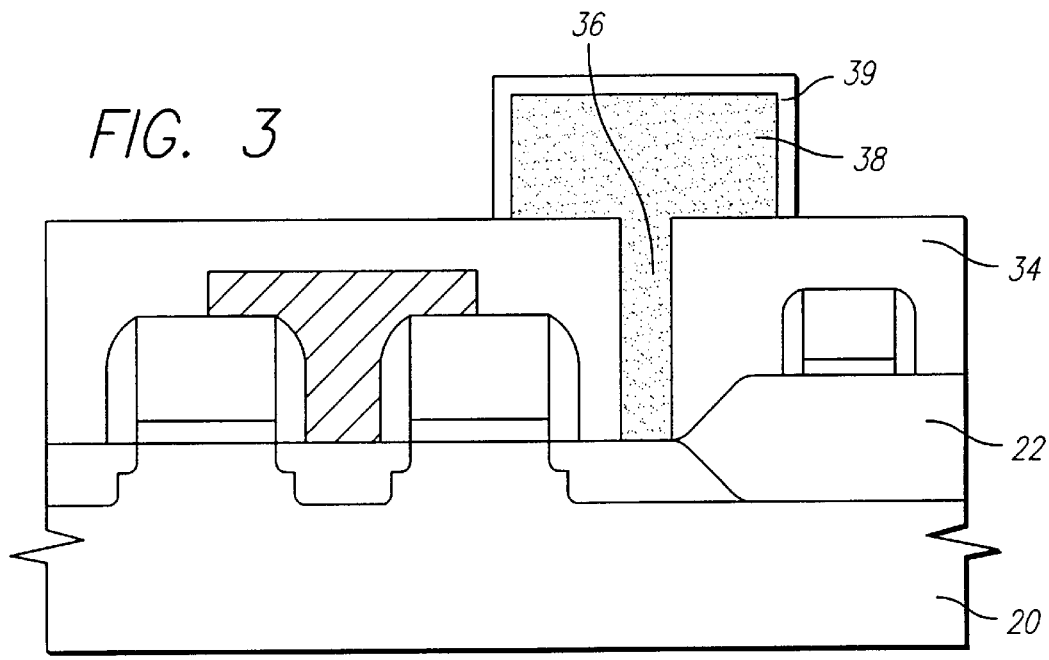
FIG. 3 is a cross-sectional representation of a partially fabricated DRAM structure having a bottom poly-Si electrode.
Figure 4:
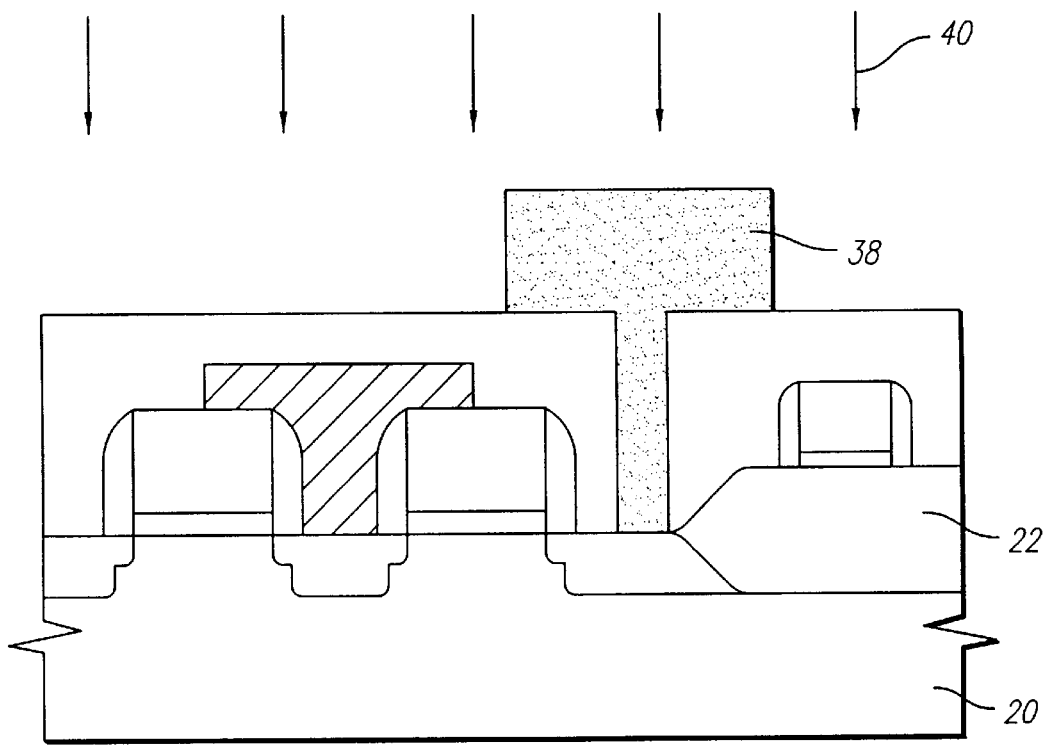
FIG. 4 is a schematic representation of the present processing step for treating the surface of the partially fabricated DRAM in FIG. 3 with an inductive coupled nitrogen plasma.
Figure 5:
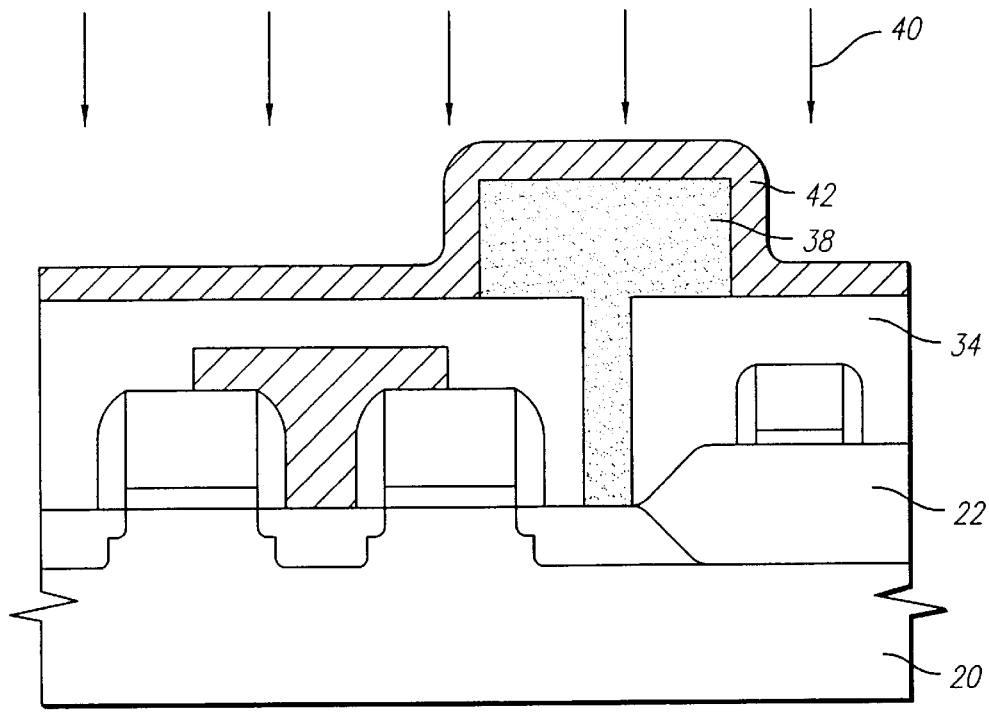
FIG. 5 is a schematic representation of the present processing step for treating an as-deposited nitride layer with an inductive coupled nitrogen plasma.

After the MOSFET is fabricated, a second poly-Si layer 38 is formed within the contact window 36 and on the dielectric layer 34 as shown in FIG. 3. Except for the contact window portion, the thickness of this poly-Si layer is approximately 150 to 300 nm. This poly-Si layer 38 may be formed by a low-pressure chemical vapor deposition (LPCVD) process. To achieve the desirable electrical conductivity, this poly-Si layer 38 may be in situ doped during the LPCVD process using a mixture of $PH_3$, $SiH_4$, and $N_2$ gases, as is known to those skilled in the art. Alternatively, the as-deposited poly-Si layer may be doped with As ions via a typical As ion implantation process. The doped poly-Si layer is then thermally annealed to activate the dopant ions and to achieve the desired conductivity. Next, the poly-Si layer is lithographically patterned and etched to form the bottom electrode of a capacitor.

In preparation for the next process step, the substrate is cleaned via a standard RCA cleaning process (using a mixture of SPM, APM and HPM) or a modified RCA/dilute hydrofluoric acid pre-cleaning process. The structure is thus inevitably exposed to an oxygen-containing environment, causing a surface oxide 39 to be formed on the ploy-Si electrode. This native oxide is typically 1 nm thick. This surface oxide layer can be largely, but not totally, removed by subjecting the substrate to an hydrofluoric acid etching or RCA etching process.

In the present invention, to remove essentially all the native surface oxide, the structure is subjected to an inductive coupled plasma (ICP) treatment 40, and preferably to an inductive coupled nitrogen plasma (ICNP) treatment using nitrogen plasma as the reactive gas. See FIG. 4. If nitrogen is used as the plasma source, the inductive coupled nitrogen plasma can penetrate into the surface region of the poli-Si layer 38 to form a nitrogen-rich surface region, which effectively suppresses the formation and growth of the native oxide. The power of the ICNP process is approximately 150 W to 300 W; the nitrogen flow rate is approximately 35 to 45 sccm (standard cubic centimeters per minute), preferably 40 sccm; the gas pressure is approximately 400 to 450 mTorr, preferably, 420 mTorr; and the processing time is approximately 8 to 12 min.

In an alternative embodiment in which tantalum pentoxide is used as the dielectric, the surface of the as-deposited poly-Si layer may also be pre-treated with the aforesaid ICP process. In the event nitrogen is used as the plasma source, this nitrogen plasma will react with the surface of the ploy-Si layer to form a nitrogen-rich surface region. Next, a tantalum pentoxide layer is deposited on the ICNP-treated poly-Si bottom electrode. Because of the ICNP treatment, the surface of the poly-Si layer is no longer susceptible to oxidation caused by oxygen diffusing through the $Ta_2O_5$ layer during the subsequent post-$Ta_2O_5$-deposition annealing process.

Once the growth of the surface oxide is suppressed by the aforementioned ICNP process, a silicon nitride layer 42, typically 5 to 15 nm thick, may be deposited via an LPCVD process on the poly-Si layer 38 and the dielectric layer 34. See FIG. 5. Depending on the specific application of the DRAM being fabricated, the surface of this nitride layer 42 may also be treated by ICP using preferably nitrogen as the reactive gas. The use of this ICNP process may form a nitrogen-rich surface layer which effectively repairs pinholes in the as-deposited nitride layer. The power of the ICNP process is approximately 150 W to 300 W; the nitrogen flow rate is approximately 35 to 45 sccm, preferably, 40 sccm; the gas pressure is approximately 400 to 450 mTorr, preferably 420 mTorr; and the processing time is approximately 8 to 12 min.

Figure 6:
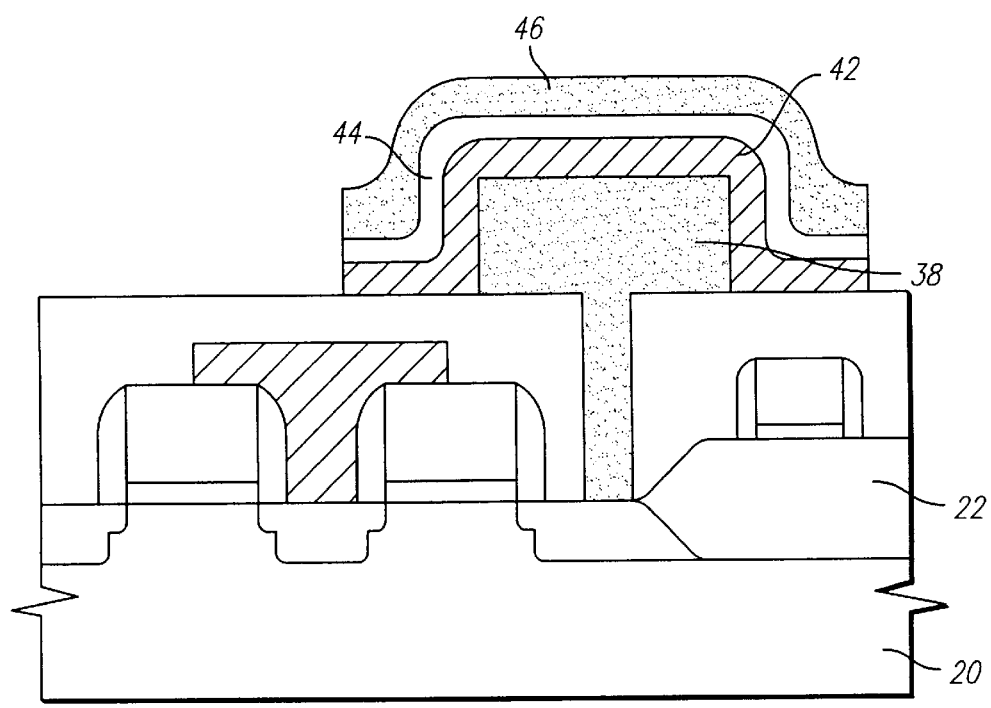
FIG. 6 is a cross-sectional view of a DRAM structure having nitride/oxide dielectric layers and poly-Si electrodes.

Next, as shown in FIG. 6, a thermal silicon dioxide layer 44 may be formed on top of the nitride layer 42. Preferably, this oxide layer 44 is formed by heating the substrate at approximately 850° C. for 20 to 40 minutes.

Finally, a third ploy-Si layer 46 is deposited and patterned on top of the oxide layer 44. This third ploy-Si layer 46 may be formed by an LPCVD process. To achieve the desirable electrical conductivity, this poly-Si layer 46 may be in-situ doped during the LPCVD process using a mixture of $PH_3$, $SiH_4$ and $N_2$ gases. The processing conditions are essentially identical to those for the deposition of the second poly-Si layer 38 as described above. Alternatively, the as-deposited poly-Si layer may be doped with As ions in a process essentially identical to that described above for the doping of the second poly-Si layer 38. The doped poly-Si layer 46 is then lithographically patterned and etched to form the top electrode of the capacitor.

The present method of fabrication may be used in the fabrication of a flash or mixed mode interpoly capacitor having a multitude of poly-Si layers. It can, of course, be used to firm a pure, stoichiometric silicon nitride layer in any other devise.

While the present invention has been particularly shown and described with reference to the above preferred embodiments, it will be understood by those skilled in the art that many other modifications and variations may be made thereto without departing from the broader spirit and scope of the invention as set forth in the claims. Use of the disclosed method is not limited to DRAMs, but may also be used in fabricating other types of devices, e.g., a flash memory or mixed mode CMOS IC's. The specification and drawings are accordingly to be regarded as being illustrative, rather than being restrictive.

What is claimed is:

1. A process for fabricating a semiconductor memory device having nitride/oxide dielectric layers on a substrate, comprising the steps of:
    forming one or more field oxide regions on said substrate to define one or more active regions;
    forming on each said active region a MOSFET comprising a gate oxide layer, a first poly-Si gate electrode layer, and a top dielectric layer;
    forming a contact window in said top dielectric layer of said MOSFET;
    forming a second poly-Si layer filling said contact window and covering portions of said top dielectric layer of said MOSFET;
    patterning said second poly-Si layer to form a bottom electrode of a capacitor;
    removing oxide from the surface of said poly-Si bottom electrode via a pre-cleaning process;
    further removing said surface oxide and generating an oxidation-resistant surface region on said poly-Si bottom electrode using an inductive coupled plasma (ICP);
    depositing a silicon nitride dielectric layer on said ICP-treated poly-Si bottom electrode;
    forming a silicon oxide dielectric layer on said nitride dielectric layer;
    depositing a third poly-Si layer on said oxide dielectric layer; and
    patterning said third poly-Si layer to form a top electrode of said capacitor.

2. The process of claim 1, wherein said poly-Si bottom electrode pre-cleaning process compromises the step of cleaning the surface of said electrode by hydrofluoric acid.

3. The process of claim 1, wherein said inductive coupled plasma (ICP) is an inductive coupled nitrogen plasma (ICNP).

4. The process of claim 3, wherein the inductive coupled nitrogen plasma is formed by using nitrogen gas at a flow rate of approximately 35 to 45 sccm.

5. The process of claim 4, wherein the nitrogen plasma is supplied at a power of approximately 150 to 300 W.

6. The process of claim 4, wherein the nitrogen gas is at a pressure of approximately 400 to 450 mTorr.

7. A process for fabricating a semiconductor memory devise having nitride/oxide dielectric layers on a substrate, comprising the steps of:
    forming one or more field oxide regions on said substrate to define one or more active regions;
    forming on each said active region a MOSFET comprising a gate oxide layer, a first poly-Si gate electrode layer, and a top dielectric layer;
    forming a contact window in said top dielectric layer of said MOSFET;
    forming a second poly-Si layer filling the contact window and covering portions of said top dielectric layer of said MOSFET;
    patterning said second poly-Si layer to form a bottom electrode of a capacitor;
    removing oxide from the surface of said poly-Si bottom electrode via a pre-cleaning process;
    further removing said surface oxide and generating an oxidation-resistant region on said surface of said poly-Si bottom electrode using a first induction coupled plasma (ICP);
    depositing a silicon nitride dielectric layer on said ICP-treated poly-Si bottom electrode;
    generating a nitrogen-rich surface region on said nitride dielectric layer using a second induction coupled plasma (ICP);
    forming a silicon oxide dielectric layer on said ICP-treated nitride dielectric layer;
    depositing a third poly-Si layer on said oxide dielectric layer; and
    patterning said third poly-Si layer to form a top electrode of said capacitor.

8. The process of claim 7, wherein said poly-Si bottom electrode pre-cleaning process comprises the step of cleaning the surface of said electrode by hydrofluoric acid.

9. The process of claim 7, wherein said first inductive coupled plasma (ICP) is an inductive coupled nitrogen plasma (ICNP).

10. The process of claim 9, wherein said second inductive coupled plasma (ICP) is an inductive coupled nitrogen plasma (ICNP).

11. The process of claim 10, wherein said first and second inductive coupled nitrogen plasmas are formed by using nitrogen gas at a flow rate of approximately 35 to 45 sccm.

12. The process of claim 11, wherein said first and second nitrogen plasmas are supplied at a power of approximately 150 to 300 W.

13. The process of claims 11, wherein the nitrogen gas is at a pressure of approximately 400 to 450 mTorr.

14. A process for fabricating a semiconductor memory devise having a tantalum pentoxide dielectric layer on a substrate, comprising the steps of:
    forming one or more field oxide regions on said substrate to define one or more active regions;
    forming on each said active region a MOSFET comprising a gate oxide layer, a first poly-Si gate electrode layer, and a top dielectric layer;
    forming a contact window in said top dielectric layer of said MOSFET;
    forming a second poly-Si layer filling the contact window and covering portions of said top dielectric layer of said MOSFET;

patterning said second poly-Si layer to form a bottom electrode of a capacitor;

removing oxide from the surface of said poly-Si bottom electrode via a pre-cleaning process;

further removing said surface oxide and generating an oxidation-resistant region on said surface of said poly-Si bottom electrode using an induction coupled plasma (ICP);

depositing a tantalum pentoxide dielectric layer on said ICP-treated poly-Si bottom electrode;

annealing said tantalum pentoxide layer;

depositing a third poly-Si layer on said tantalum pentoxide dielectric layer; and patterning said third poly-Si layer to form a top electrode of said capacitor.

15. The process of claim 14, wherein said poly-Si electrode pre-cleaning process comprises the step of cleaning the surface of said electrode by hydrofluoric acid.

16. The process of claim 14, wherein said inductive coupled plasma (ICP) is an inductive coupled nitrogen plasma (ICNP).

17. The process of claim 16, wherein said inductive coupled nitrogen plasma is formed by using nitrogen gas at a flow rate of approximately 35 to 45 sccm.

18. The process of claim 17, wherein said nitrogen plasma is supplied at a power of approximately 150 to 300 W.

19. The process of claim 17, wherein said nitrogen gas is at a pressure of approximately 400 to 450 mTorr.

* * * * *